United States Patent
Buffa et al.

(10) Patent No.: US 10,447,294 B2
(45) Date of Patent: Oct. 15, 2019

(54) SYSTEM AND METHOD FOR AN OVERSAMPLED DATA CONVERTER

(71) Applicant: Infineon Technologies Austria AG, Villach (AT)

(72) Inventors: Cesare Buffa, Villach (AT); Fernando Cardes Garcia, Madrid (ES); Luis Hernandez-Corporales, Madrid (ES); Andrés Quintero Alonso, Leganés (ES); Andreas Wiesbauer, Poertschach (AT)

(73) Assignee: Infineon Technologies Austria AG, Villach (AT)

( * ) Notice: Subject to any disclaimer, the term of this patent is extended or adjusted under 35 U.S.C. 154(b) by 92 days.

(21) Appl. No.: 15/608,807

(22) Filed: May 30, 2017

(65) Prior Publication Data
US 2018/0351571 A1 Dec. 6, 2018

(51) Int. Cl.
*H03M 1/60* (2006.01)
*H03M 3/00* (2006.01)
*H03M 1/50* (2006.01)

(52) U.S. Cl.
CPC ........... *H03M 3/496* (2013.01); *H03M 1/504* (2013.01); *H03M 1/60* (2013.01); *H03M 3/438* (2013.01)

(58) Field of Classification Search
CPC ...... G04F 10/005; G04F 10/06; G04F 10/105; H03L 2207/50; H03L 7/0992; H03L 7/1976; H03L 2207/06; H03L 2207/18; H03L 7/235; H03B 2200/0094; H03M 1/60; H03M 3/438; H03M 3/496
USPC .......... 375/316, 328, 354, 371–376
See application file for complete search history.

(56) References Cited

U.S. PATENT DOCUMENTS

| | | | | |
|---|---|---|---|---|
| 7,139,361 B1 * | 11/2006 | Nguyen | ............. | H03K 5/15066 377/47 |
| 8,866,536 B1 * | 10/2014 | Chen | .......... | G05F 3/08 327/512 |
| 9,425,813 B2 * | 8/2016 | Lesso | ...................... | H03M 1/18 |
| 2003/0067825 A1 * | 4/2003 | Shimano | ............... | G11C 11/406 365/222 |

(Continued)

FOREIGN PATENT DOCUMENTS

EP 2773046 A2 9/2014

OTHER PUBLICATIONS

Schreire, R., & Temes, G. C. (2005). Understanding delta-sigma data converters. Piscataway, NJ: Wiley-IEEE Press.
H. Zare-Hososeini and I. Kale, "Clock-Jitter Reduction Techniques in Continuous Time Delta-Sigma Modulators," VLSI Design, Automation and Test, 2006 International Symposium on, Hsinchu, Apr. 2006, 2 pages.
T. Watanabe, T. Mizuno and Y. Makino, "An all-digital analog-to-digital converter with 12-μV/LSB using moving-average filtering," in IEEE Journal of Solid-State Circuits, vol. 38, No. 1, pp. 120-125, Jan. 2003.

(Continued)

*Primary Examiner* — Emmanuel Bayard
(74) *Attorney, Agent, or Firm* — Slater Matsil, LLP

(57) ABSTRACT

In accordance with an embodiment, a circuit includes a first oscillator having an oscillation frequency dependent on an input signal at a first input, where the first oscillator is configured to oscillate when an enable input is in a first state and freeze its phase or reduce its frequency when the enable input is in a second state. The circuit also includes a first time-to-digital converter having an input coupled to an output of the first oscillator, and a pulse generator having an input coupled to a first clock input of the circuit and an output coupled to the enable input of the first oscillator, where the pulse generator is configured to produce a pulse having pulse width less than a period of a clock signal at the first clock input.

23 Claims, 11 Drawing Sheets

(56) References Cited

U.S. PATENT DOCUMENTS

| | | | |
|---|---|---|---|
| 2008/0180299 A1* | 7/2008 | Forejt | G04F 10/005 |
| | | | 341/166 |
| 2009/0302816 A1* | 12/2009 | Kunimatsu | H02M 1/36 |
| | | | 323/282 |
| 2010/0237842 A1* | 9/2010 | Ishimori | H02M 3/073 |
| | | | 323/282 |
| 2012/0286987 A1 | 11/2012 | Kawaguchi et al. | |
| 2013/0307713 A1 | 11/2013 | Kawaguchi et al. | |
| 2014/0253535 A1* | 9/2014 | Lim | G09G 5/008 |
| | | | 345/213 |
| 2014/0270261 A1 | 9/2014 | Wiesbauer et al. | |
| 2018/0034468 A1* | 2/2018 | Faisal | H03L 7/0997 |
| 2018/0102767 A1* | 4/2018 | Hsieh | H03K 5/00006 |

OTHER PUBLICATIONS

Fishani, Amir Babaie "High Order VCO Based Delata Sigma Modulator," Tech Lane Ghent Science Park—Campus A, iGent Auditorium, Jan. 18, 2017, 158 pages.

Yu, Wonsik et al., "A Time-Domain High-Order MASH ΔΣ ADC Using Voltage-Controlled Gated-Ring Oscillator," IEEE Transaction on Circuits and Systems—I, Regular Papers, vol. 60, No. 4, Apr. 2003, pp. 856-866.

\* cited by examiner

SYSTEM AND METHOD FOR AN OVERSAMPLED DATA CONVERTER

TECHNICAL FIELD

The present invention relates generally to an electronic device, and, in particular embodiments, to a system and method for an oversampled data converter.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

In applications where MEMS microphones are implemented in small form factor packages such as smartphones or tablet computers, the MEMS microphone is typically coupled to an integrated circuit that biases the MEMS microphone, amplifies the output of the MEMS microphone, and performs and analog-to-digital conversion on the electrical output of the MEMS microphone. Each of these functions consumes power and may consume valuable chip and/or board area. It is also the case, however, that small form factor applications are often low power, battery operated devices that are sensitive to power consumption. In order to maintain a long battery life, the power consumption of the MEMS microphone, its board level audio interface, and the size of its electrical components is minimized in order to conserve battery life and maintain a small form factor.

SUMMARY

In accordance with an embodiment, a circuit includes a first oscillator having an oscillation frequency dependent on an input signal at a first input, where the first oscillator is configured to oscillate when an enable input is in a first state and freeze its phase or reduce its frequency when the enable input is in a second state. The circuit also includes a first time-to-digital converter having an input coupled to an output of the first oscillator, and a pulse generator having an input coupled to a first clock input of the circuit and an output coupled to the enable input of the first oscillator, where the pulse generator is configured to produce a pulse having pulse width less than a period of a clock signal at the first clock input.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to embodiments in a specific context, namely an oversampled data conversion system and method for a capacitive signal source such as a MEMS sensor or microphone, and capacitive sensors such as pressure sensors and accelerometers. The invention may also be applied, however, to other types of circuits and systems where an electrical or physical magnitude can be encoded into the frequency of a signal, such as audio systems, communication systems, and sensor systems.

In embodiments of the present invention, oscillators are used as integration elements in an oversampled data converter. These oscillators may be implemented, for example, using voltage controlled oscillators (VCOs), current controlled oscillators (CCOs), reactance controlled oscillators and/or digitally controlled oscillators (DCOs), or any other type of oscillator known in the art with a controllable frequency. The effect of phase noise or jitter of a system sampling clock is reduced by limiting the operation of the VCOs and/or DCOs to only a first portion of a sampling period and freezing the VCOs and/or DCOs during a second portion of the sampling period. In some embodiments, this is accomplished by using a local pulse generator to activate and deactivate the VCOs and/or DCOs. When the oscillator is deactivated, most or all of the energy stored in reactive components such as capacitors or inductors remains unchanged. Therefore, the phase state of the oscillator is preserved during the activation. Because the timing jitter of the local pulse generator has a lower amplitude than the timing jitter of the system sampling clock, the signal to noise ratio of embodiments oversampled data converters experience less degradation due to clock jitter on the system sampling clock in some cases.

Figure 1A:
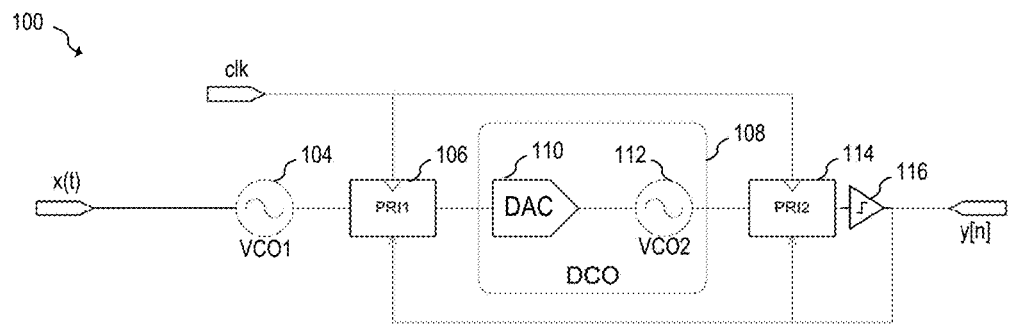
FIG. 1A illustrates a schematic of an exemplary oversampled data converter.

FIG. 1A illustrates an exemplary second order oversampled data converter 100 that uses voltage controlled oscillators (VCOs) 104 and 112 as integration elements. As shown, VCO 104 receives input signal x(t) and produces a signal having an output frequency proportional to input signal x(t). The output of VCO 104 is accumulated by phase reference integrator 106. Accordingly, the combination of VCO 104 and phase reference integrator 106 functions as a first integrator of the oversampled data converter.

The digital output of phase reference integrator 106 is used to set the frequency of DCO 108, the output of which is accumulated by phase reference integrator 114. As shown, DCO 108 may be implemented using a current digital to analog converter (IDAC) 110 and VCO 112. Comparator 116 compares the output of phase reference integrator 114 with a predetermined value to produce digital output y[n]. Feedback counters within phase reference integrators 106 and 114 are incremented and decremented based on digital output y[n]. In some embodiments, comparator 116 may be a multi-bit comparator and/or an analog-to-digital converter for multi-bit converter implementations.

In many practical data conversion systems, the system sampling clock (clk) used by oversampled data converter 100 is supplied, for example, by a digital CODEC circuit (not shown) that performs audio processing on the received output y[n]. Oftentimes the system sampling clock generated by the digital CODEC is heavily jittered due to noisy clock generation circuitry and long clock paths that are sensitive to power supply disturbances. The timing uncertainty caused by this jitter may degrade the performance of oversampled data converter 100 by introducing uncertainty in the final values of phase reference integrators 106 and 114 at the end of each clock cycle. The effect of jitter on the system sampling clock is illustrated in FIGS. 1B and 1C.

Figure 1B:
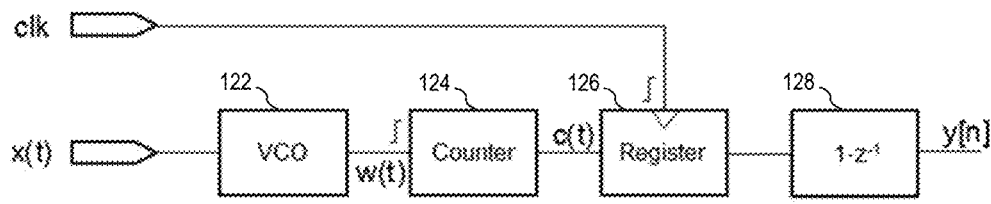
FIG. 1B illustrates a block diagram of a portion of a first order oscillator-based sigma-delta modulator.

FIG. 1B illustrates a functional block diagram of a portion of a first order oscillator-based sigma-delta modulator that includes VCO 122, counter 124, register 126 and difference block 128. As shown, the output w(t) of VCO 122 causes counter 124 to increment, register 126 samples the output c(t) of counter 124 at an edge of the system sampling clock, and difference block 128 subtracts a previous value of the register 126 from a present value of register 126 to produce digital output y[n]. During operation, VCO 122, counter 124, and register 126 encodes signal x(t) into a number of cycles that occur during a sample period defined by the system sampling clock.

Figure 1C:
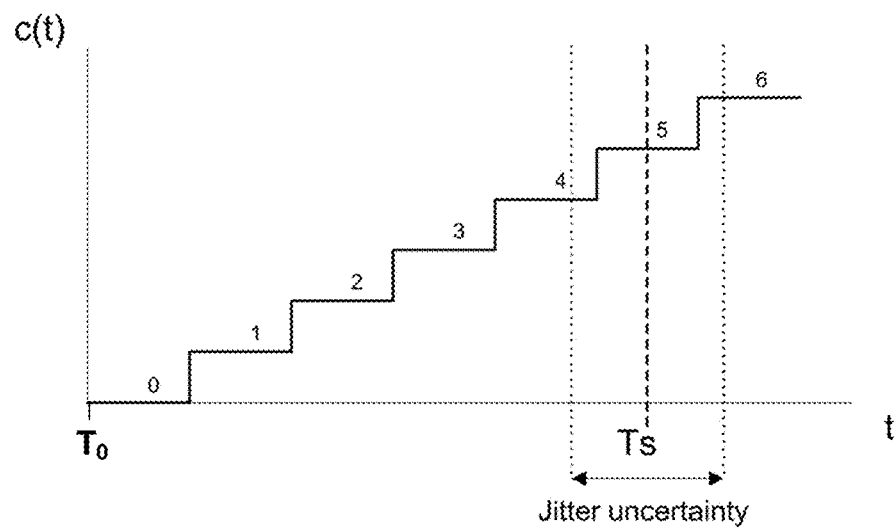
FIG. 1C illustrates an waveform diagram illustrating the operation of the system of FIG. 1B.

FIG. 1C illustrates an annotated waveform diagram that shows the output c(t) of counter 124 with respect to time. As shown, output c(t) of counter 124 increments from zero to six starting from time $t=T_o$ at the beginning of a clock cycle of the system sampling clock. Time Ts represents both the ideal time at which the next clock cycle of the system sampling clock begins, as well as the ideal time at which the value of counter 124 is sampled by register 126 for a non-jittered clock. Thus, if the system sampling clock has negligible jitter, the sampled value of counter 124 is five, as shown in FIG. 1C. However, in systems where the system sampling clock has appreciable jitter, as represented on the waveform diagram by a jitter uncertainty window bounded by dotted lines, the actual sampled value may deviate from five. For example, jitter on the system sampling clock may cause register 126 to sample counter 124 one count early yielding a sampled value of four, or may cause register 126 to sample counter 124 one count late to yield a sampled a value of six. From the perspective of system performance, these jitter-induced sampling errors decrease the SNR of the oversampled modulator.

In embodiments of the present invention, the effect of jitter on the sampled values of the phase reference integrators is reduced by decreasing the operating period of the oscillator to be less than the period of system sampling clock. In some embodiments, oscillators are enabled for a first portion of each period of the system sampling clock and disabled for a second portion of the period. This may be accomplished, for example, by locally generating sampling signal having less timing uncertainty than the system sampling clock. The phase of the oscillators are stored or "frozen" during the time that the oscillator is disabled. Alternatively, the oscillators may be disabled by significantly reducing the frequency of oscillation such that the phase of the oscillators advance at a slow rate compared to the nominal operating frequency. In some embodiments, the frequency of oscillation is reduced to a frequency that is at least ten times lower than the nominal operating frequency. The actual reduction in frequency may be determined according to the clock jitter, the monostable jitter, the target resolution and other parameters of the target system. Therefore, the reduced frequency may be lower than the nominal operating frequency by than other multiples besides ten times. In some embodiments, the frequency of the oscillator may be increased in order to compensate for the decrease in the period of operation for each cycle. FIGS. 2A to 2D illustrate the operation of an embodiment oscillator-based oversampled data converter 200 that operates according to these principles.

Figure 2A:
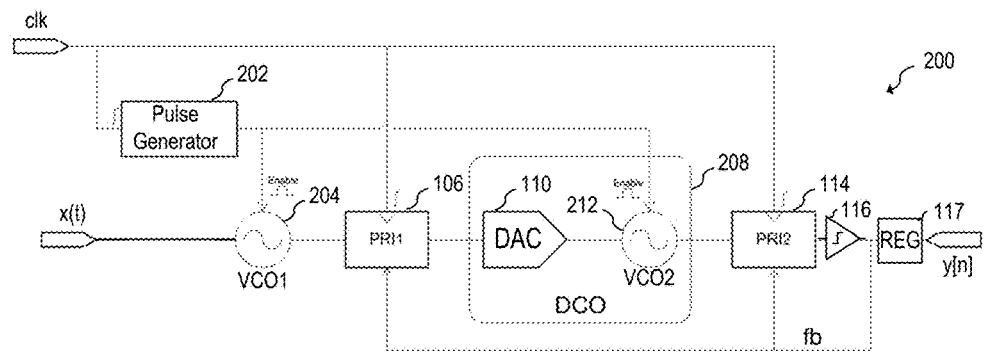
FIG. 2A illustrates a schematic of an embodiment oversampled data converter.

FIG. 2A illustrates an embodiment second order oversampled data converter 200 that is similar to oversampled data converter 100 shown in FIG. 1A with the addition of pulse generator 202. In addition, continuously running oscillators VCOs 104 and 112 are replaced by oscillators 204 and 212 that are configured to be enabled and disabled by pulse generator 202. In various embodiments, pulse generator 202 produces a pulse having a pulse width that is narrower than a full period than the system sampling clock. This pulse may be triggered by the rising edge of the system sampling clock. Alternatively pulse generator 202 may produce the pulse at the falling edge of system sampling clock clk. In some embodiments, digital output signal y[n] is sampled by register 117.

In one example, the pulse width produced by pulse generator 202 is 50% of the period of the system sampling clock and the frequency of oscillators 204 and 212 are doubled with respect to oscillators 104 and 112 in data converter 100. By increasing the oscillation frequency inversely proportionally to the period of operation, the gain of the oscillator-based integrators of embodiment oversampled data converter 200 can be kept constant with respect to the gain of the oscillator-based integrators in oversampled data converter 100. Alternatively, other pulse widths and oscillation frequencies may be used. During operation, oscillators 204 and 212 are activated by pulse generator 202 during the first portion of the period of the system sampling clock and disabled by pulse generator 202 during the second sampling period.

In one embodiment directed toward a data converter configured to convert an audio-bandwidth signal to a digital signal, oscillator 204 associated the first stage of integration of oversampled data converter 200 operates at a frequency of about 10 MHz, and oscillator 212 associated with the second stage of integration oscillates at a frequency of between about 4 MHz and about 20 MHz. Alternatively, different frequencies may be used depending on the particular system and its specifications.

Figure 2B:
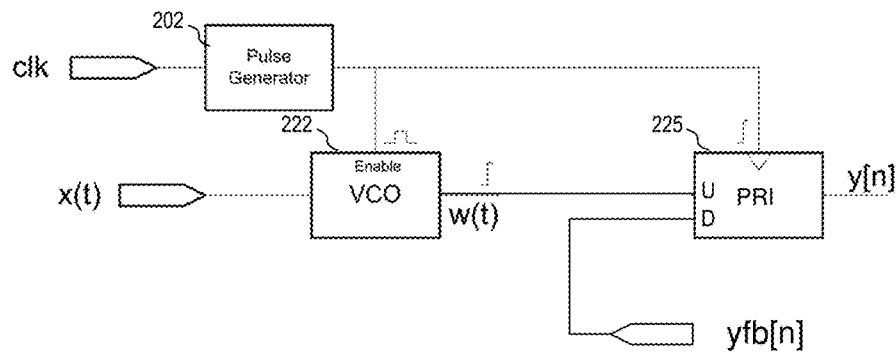
FIG. 2B illustrates a block diagram of a portion of an embodiment first order oscillator-based sigma-delta modulator.

FIG. 2B illustrates a functional block diagram of portion a first order oscillator-based sigma-delta modulator that includes oscillator 222, phase reference integrator 225 and pulse generator 202 according to an embodiment of the present invention. As shown, oscillator output w(t) of oscillator 222 causes the output y[n] phase reference integrator 225 to increment at each rising edge. Pulse generator 202 produces a timing pulse that enables oscillator 222 for a portion of the period of the system sampling clock. In addition, the value of feedback signal yfb[n] is subtracted from the output y[n] of phase reference integrator 225 at each rising edge of the timing pulse. During the time that oscillator 222 is enabled by pulse generator 202, oscillator 222 continues to produce edges that causes the output y[n] of phase reference integrator to be incremented. When oscillator 222 is disabled, the phase of oscillator 222 is stored or "frozen" such that oscillator resumes operation at its previously stored phase at the beginning of the next cycle. Alternatively, oscillator 222 may be disabled by significantly reducing the frequency of oscillation such that the phase of oscillator 222 advances at a slow rate compared to the nominal operating frequency. In some embodiments, the frequency of oscillation is reduced to a frequency that is at least ten times lower than the nominal operating frequency. Alternatively, the reduced frequency may be lower than the nominal operating frequency by than other multiples besides ten times.

Figure 2C:
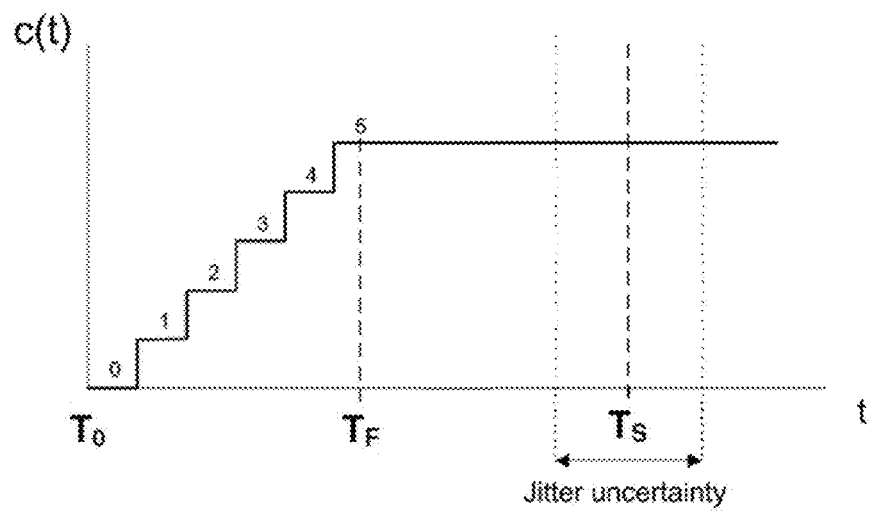
FIG. 2C illustrates an waveform diagram illustrating the operation the system of FIG. 2B.

FIG. 2C illustrates an annotated waveform diagram showing the output c(t) of counter 124 with respect to time. As shown, output c(t) of counter 223 increments from zero to five starting from time $t=T_o$ at the beginning of a clock cycle of the system sampling clock while oscillator 222 is enabled. At time $T_F$, oscillator 222 is disabled and counter 223 stops incrementing at a time that precedes the jitter uncertainty window of system sampling clock clk. Thus, register 126 can sample output c(t) of counter 223 anytime from $T_F$ to time Ts at which the next sampling cycle starts without causing a jitter induced sampling error. In embodiments in which oscillator 222 is stopped before counter 223 is sampled by register 126, the risk of metastability in the sampling of counter 223 is reduced. Thus, the various oscillators of embodiment oscillator-based oversampled converters can run asynchronously with respect to each other and with respect to the system sampling clock without the risk of race conditions or metastability.

Figure 3A:
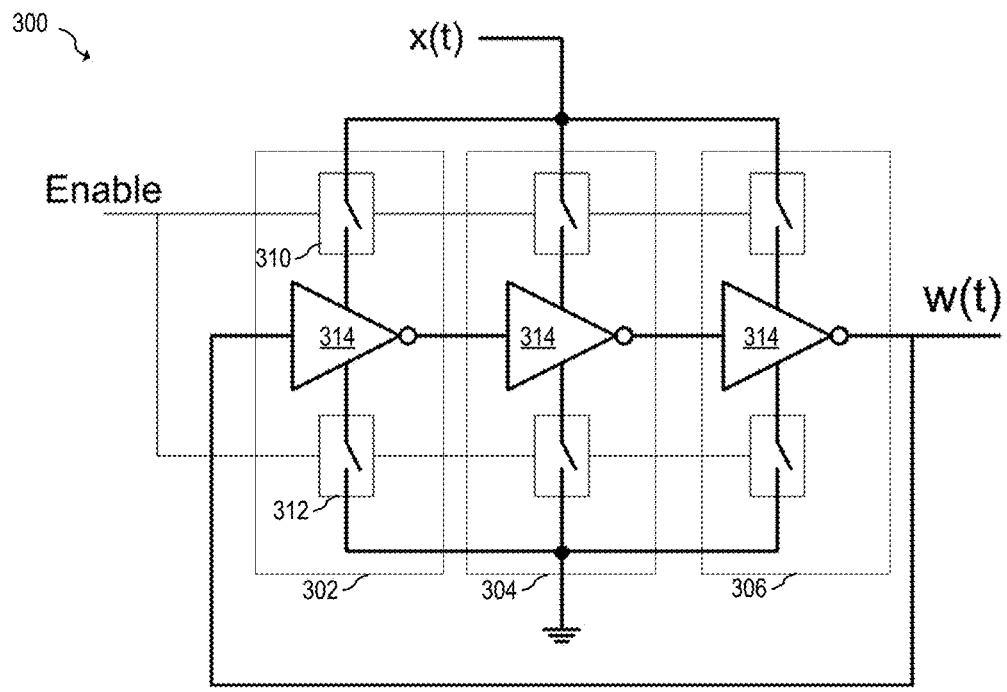
FIGS. 3A-3F illustrate schematics and waveform diagrams describing embodiment oscillator circuits.

FIG. 3A illustrates a schematic of a voltage controlled gated three-stage ring oscillator 300 that may be used to implement oscillators 204, 212 and 222 shown in FIGS. 2A and 2C. As shown, each stage 302, 304 and 306 of ring oscillator 300 includes an inverter 314 and activation switches 310 and 312. During operation, when enable signal Enable is in an active state, activation switches 310 and 312 are closed and ring oscillator 300 produces an oscillating signal. On the other hand, when enable signal Enable is in an inactive state, activation switches 310 and 312 are open and ring oscillator 300 is frozen. Because the current path to inverters 314 is isolated via activation switches 310 and 312, the voltages at the output of each stage 302, 304 and 306 are held, thereby retaining the phase of ring oscillator 300. When enable signal Enable becomes active again, ring oscillator 300 resumes operation at the previously retained phase. The frequency of ring oscillator 300 may be determined by a voltage applied to input node x(t) or may be determined by a current introduced into node x(t). Alternatively, each stage 302, 304 and 306 may have an associated controlled current source that produces a current proportional to signal x(t). In some embodiments, ring oscillator 300 may be disabled by significantly reducing the frequency of oscillation such that the phase of ring oscillator 300 advances at a slow rate compared to the nominal operating frequency. This could be done, for example, by adding a finite resistance in parallel with each of activation switches 310 and 312. In alternative embodiments, the frequency of ring oscillator 300 may be reduced by providing a low value of x(t) while ring oscillator 300 is disabled. In some embodiments, the frequency of oscillation is reduced to a frequency that is at least ten times lower than the nominal operating frequency. Alternatively, the reduced frequency may be lower than the nominal operating frequency by other multiples besides ten times.

Figure 3B:
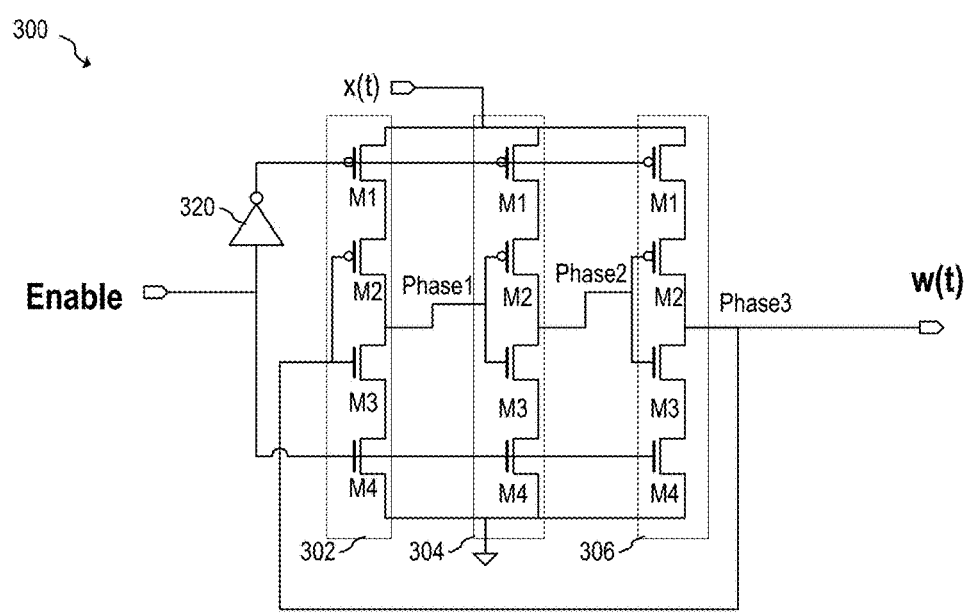

FIG. 3B illustrates one possible transistor-level implementation of ring oscillator 300. As shown each stage 302, 304 and 306 includes PMOS transistor M1 and NMOS transistor M4 that function as activation switches 310 and 312 shown in FIG. 3A. Each stage 302, 304 and 306 further includes PMOS transistor M2 and NMOS transistor M3 that function as inverter 314 shown in FIG. 3A. When enable signal Enable is active, PMOS transistor is turned-on via inverter 320 and NMOS transistor M4 is turned-on via enable signal Enable, thereby allowing current flow through transistors M2 and M3 of each stage 302, 304 and 306. In some embodiments, the oscillation frequency of ring oscillator 300 is proportional to the voltage or current applied to node x(t). When transistors M1 and M4 are turned off via enable signal Enable and inverter 320, current stops flowing though transistors M2 and M3, which deactivates and the ring oscillator 300. In various embodiments, transistors M1 and M4 function as sampling switches, thus the phase of the frozen oscillator is stored on the parasitic capacitance coupled to output nodes Phase1, Phase2 and Phase3 of stages 302, 304 and 306, respectively.

It should be appreciated that the transistor-level structure of ring oscillator 300 shown in FIG. 3B is just one of many examples of possible ring oscillator structures. In alternative embodiments of the present invention, stages 302, 304 and 306 may be implemented using other ring oscillator stage circuits known in the art, such as differential delay stages and current starved ring oscillator stages. In further alternative embodiments, the frequency of ring oscillator 300 shown in FIGS. 3A and 3B may be controlled by a current instead of a voltage in order to implement a current controlled oscillator.

Figure 3C:
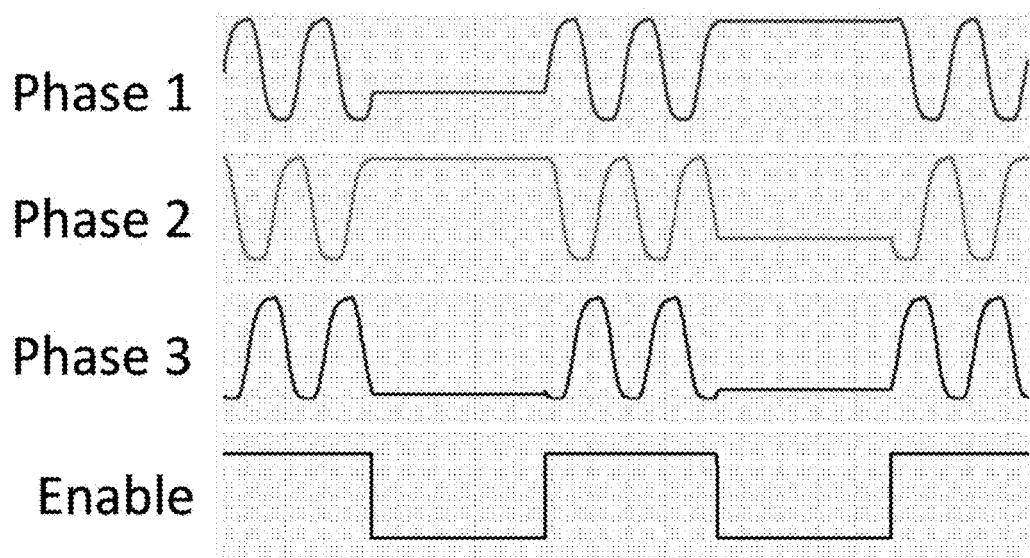

FIG. 3C illustrates a waveform diagram showing the relationship between enable signal Enable and the voltages of outputs Phase1, Phase2 and Phase3 of ring oscillator 300 shown in FIG. 3C. As shown, outputs Phase1, Phase2 and Phase3 of ring oscillator 300 are active when enable signal Enable is high and inactive when enable signal Enable is low. In addition, when the Enable signal is low, the voltages of voltages of outputs Phase1, Phase2 and Phase3 are held, which effectively stores the phase of ring oscillator 300 until ring oscillator 300 is re-enabled.

In various embodiments, the transistors M1, M2, M3 and M4 are sized to reduce errors due to charge injection when ring oscillator 300 is enabled or disabled via transistors M1 and M4. In such embodiments, the capacitance at the output of stages 302, 304 and 306 of ring oscillator is made large enough to reduce the effect of charge injected by transistors M1 and M4.

Figure 3D:
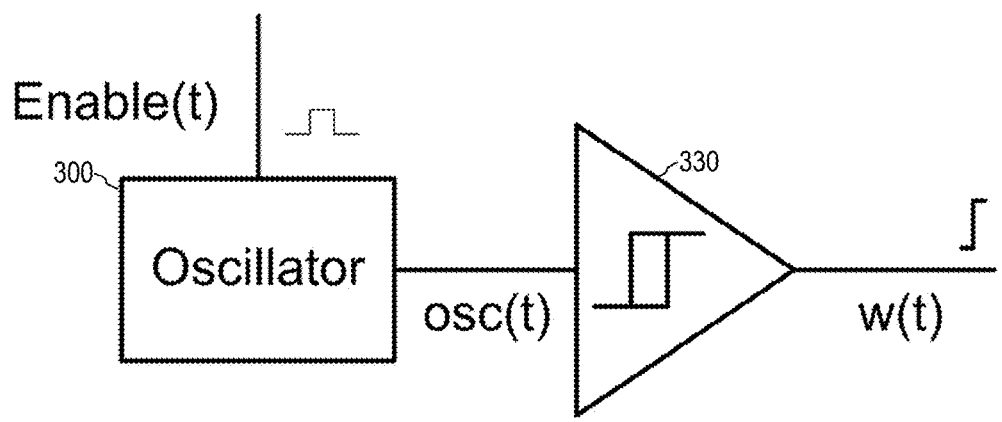
Figure 3E:
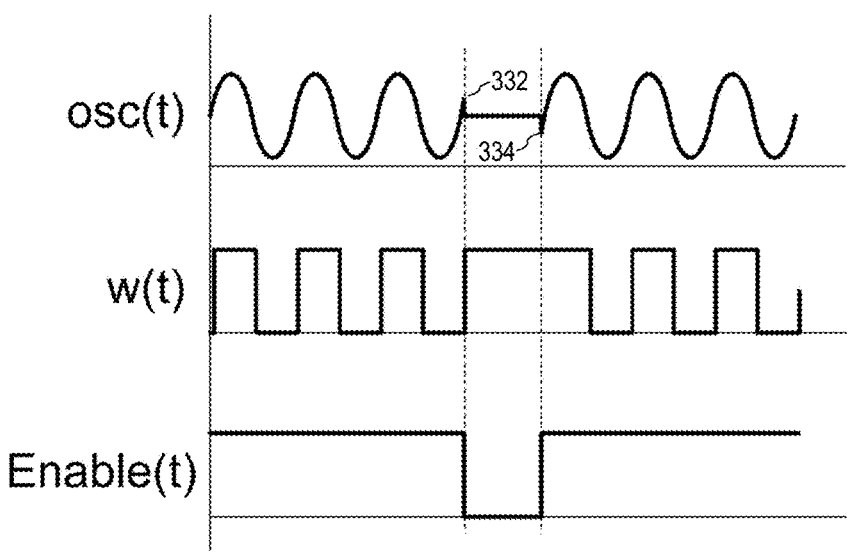

In some embodiments, a comparator with hysteresis 330 is coupled to the output of an embodiment oscillator 300 to prevent charge-injection related glitching from unexpectedly triggering a flip-flop or register in a succeeding stage, as shown in FIG. 3D. Comparator with hysteresis 330 may be implemented, for example, using comparator circuits and Schmitt trigger circuits known in the art. FIG. 3E illustrates a waveform diagram that shows the relationship between oscillator 300 output signal osc(t), the output w(t) of comparator with hysteresis 330 and enable signal Enable(t). As shown, glitches 332 and 334 are present on oscillator 300 output signal osc(t) at each transition of enable signal Enable(t). By using comparator with hysteresis 330, false triggering cause by glitches 332 and 334 may be avoided.

While the operation of only three stages are illustrated with respect to FIGS. 3A to 3C for the sake of illustration, it should be appreciated that ring oscillator 300 may have any number of stages greater than or equal to 3 for single ended inverter implementations and any number of stages greater than or equal to 2 if differential amplifiers and/or inverters are used.

Figure 3F:
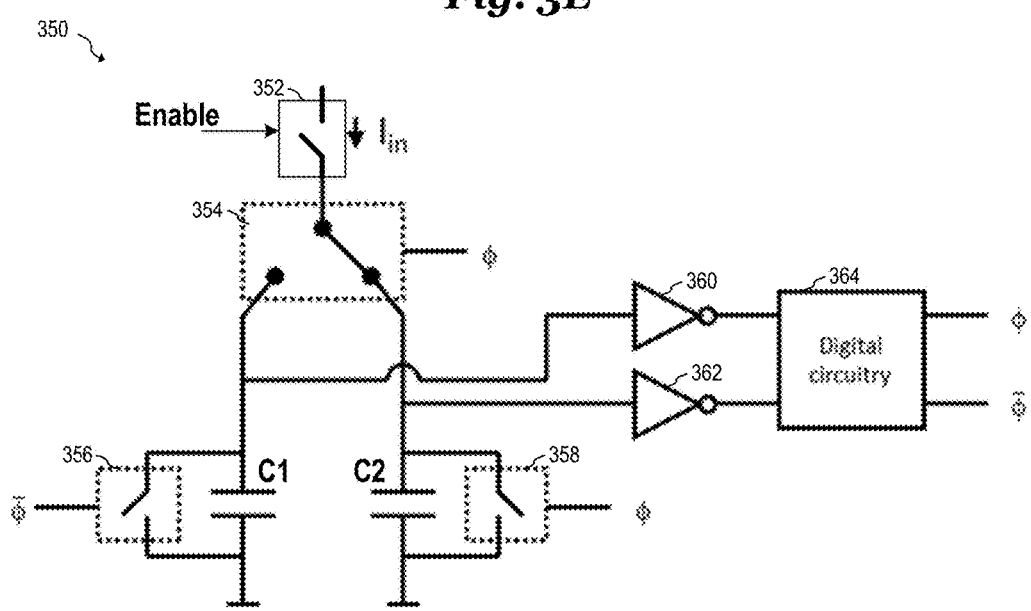

FIG. 3F illustrates a schematic of a current controlled relaxation oscillator 350 that may be used to implement oscillators 204, 121 and 222 shown in FIGS. 2A and 2C above. In an embodiment, current $I_{in}$ charges capacitors C1 and C2 in an alternating fashion. For example, as capacitor C1 is charging via switch 354, capacitor C2 is grounded via switch 358. Once capacitor C1 is charged to the threshold voltage of inverter 360, capacitor C1 is grounded via switch 356 and capacitor C2 is charged via switch 354. The frequency of current controlled relaxation oscillator 350 may be adjusted by controlling current $I_{in}$ used to charge capacitors C1 and C2. Moreover, oscillator 350 may be disabled by opening switch 352 via enable signal Enable. When oscillator 350 is disabled, the phase of oscillator 350 is retained on one of capacitors C1 and C2. When oscillator 350 is once again enabled, the operation of oscillator 350 resumes at the same phase stored in one of the capacitors C1 and C2.

During operation, when phase φ is active, current $I_{in}$ is routed to capacitor C1 via switch 354 and current $I_{in}$ charges capacitor C1 until the voltage across capacitor C1 exceeds the threshold voltage of inverter 360. Once this condition is detected, digital circuitry deactivates phase φ and activates φb. When φb is active, switch 356 grounds capacitor C1, current $I_{in}$ is routed to capacitor C2 via switch 354 and current $I_{in}$ charges capacitor C2 until the voltage across capacitor C2 exceeds the threshold voltage of inverter 362. Once this condition is detected, digital circuitry 364 activates phase φ and deactivates φb. Switch 358 grounds capacitor C2 and the operation of oscillator 350 repeats itself as current $I_{in}$ charges capacitor C1.

It should be appreciated that the example oscillators 300 and 350 described with respect to FIGS. 3A-3F above are just a few examples of many possible oscillator circuits that could be used to implement embodiments oscillators described herein.

Figure 4A:
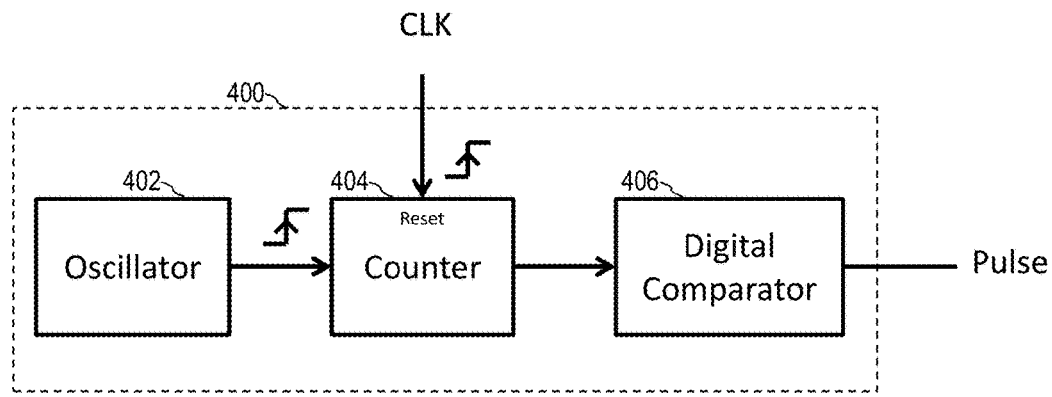
FIGS. 4A-4D illustrate schematics and block diagrams describing embodiment pulse generator circuits.

FIGS. 4A-4D illustrate various pulse generation circuits that may be used to implement pulse generator 202 shown in FIGS. 2A and 2C. FIG. 4A illustrates an oscillator-based pulse generator 400 that includes oscillator 402, counter 404 and digital comparator 406. During operation, clock signal CLK resets counter 404, and counter 404 begins to count edges generated by oscillator 402. Digital comparator 406 compares the output of counter 404 with a predetermined digital value. Once the value of counter 404 passes the predetermined digital value, digital comparator 406 generates a pulse. In some embodiments, multiple thresholds could be used such that the output of digital comparator 406 is high when the output of counter 404 is within a predetermined range of digital values. This way, the relative phase of the pulse may be adjusted with respect to the rising edge of clock signal CLK. Digital comparator 406 may also have multiple control outputs used to generate other control signals used by various components of the system. For example, digital comparator 406 may generate a separate control signals to control the sampling of the last stage phase reference integrator or control the digital calculations performed within each phase reference integrators. Oscillator 402, counter 404 and digital comparator 406 may be implemented using oscillator, counter and digital comparator circuits known in the art.

Figure 4B:
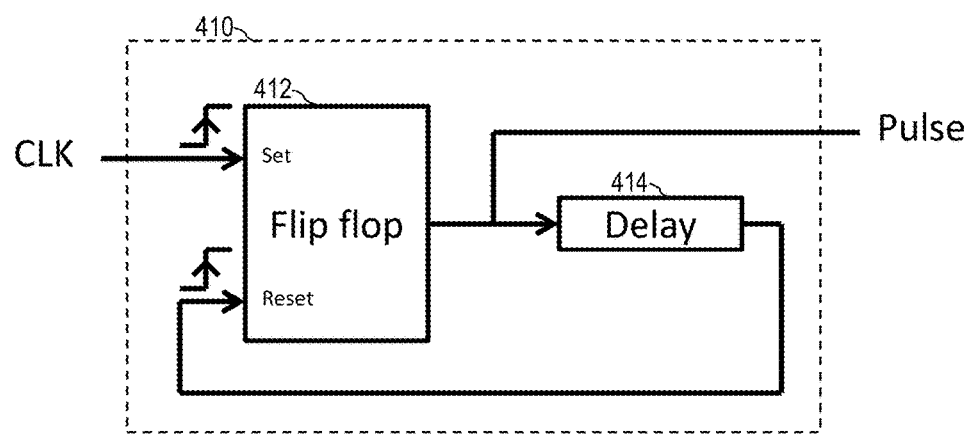

FIG. 4B illustrates a further pulse generation circuit 410 that may be used to implement pulse generator 202 shown in FIGS. 2A and 2B. As shown, pulse generation circuit 410 includes SR flip-flop 412 and delay element 414. It should be understood that the use of an SR flip-flop is just one example of many types of register circuits that could be used in embodiment pulse generators. In alternative embodiments, pulse generator 410 may adapted to use other types of flip-flops or register circuits. During operation clock signal CLK sets flip-flop 412, thereby causing pulse signal Pulse to become high. After a delay period defined by delay period 414, flip-flop 412 is reset and pulse signal Pulse becomes low. Thus, in various embodiments, the pulse generation circuit 410 generates a pulse that has a pulse width that corresponds to the delay time of delay element 414.

Figure 4C:
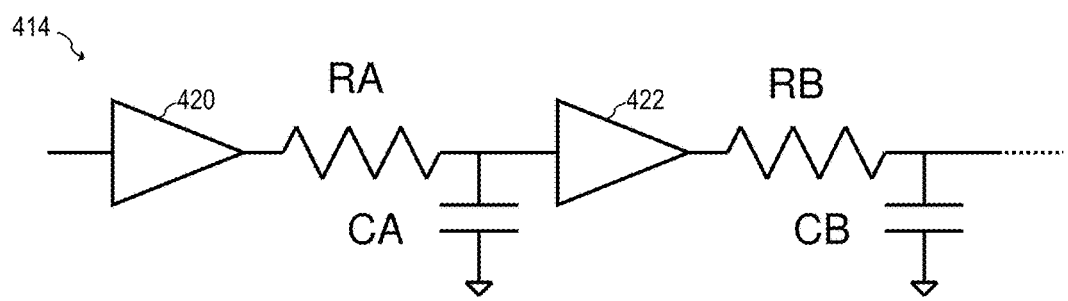

FIG. 4C illustrates a delay circuit 414 that may be used to implement delay circuit 414 shown in FIG. 4B. As shown, delay circuit 414 includes a first delay stage that includes buffer 420 followed by a first order RC circuit that includes series resistor RA and shunt capacitor CA. The first delay stage is followed by a second delay stage that includes buffer 422 followed by a further first order RC circuit that includes series resistor RB and shunt capacitor CB. In one specific embodiment, resistors RA and RB have a resistance of about 1 kΩ and capacitors CA and CB have a capacitance of 400 fF. In alternative embodiments, other resistance values for resistors RA and RB and other capacitance values for capacitors CA and CB may be used to implement the particular delay needed according to the specifications of the particular system. It should also be appreciated that in alternative embodiments, delay circuit 414 may include more than or less than two delay stages shown in FIG. 4C.

Figure 4D:
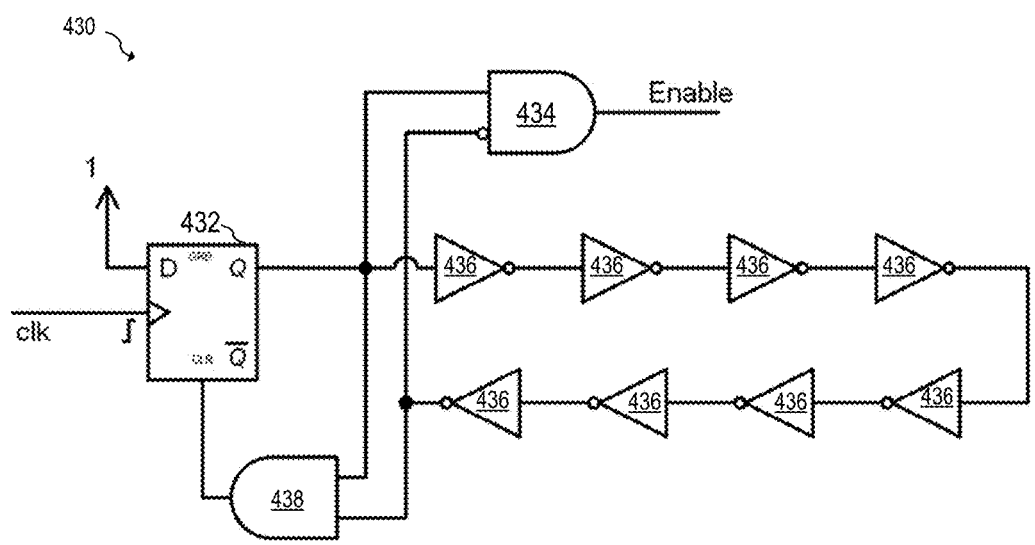

FIG. 4D illustrates a further pulse generation circuit 430 that may be used to implement pulse generator 202 shown in FIGS. 2A and 2C. As shown, pulse generation circuit 410 includes D flip-flop 432 followed by a chain of inverters 436 that function as delay elements. The output of inverters 436 are coupled to the CLR terminal of flip-flop 432 via AND gate 438 and the pulse output of pulse generation circuit 430 is generated by AND gate 434 that produces a high output when the Q output of flip-flop 432 is high and the output of the chain of inverters 436 is low. In various embodiments, the pulse width of the pulse generated by pulse generation circuit 430 is set by the delay time of inverters 436, AND gate 438 and the time that it takes for flip-flop 432 to clear. In alternative embodiments, inverters 436 may be replaced by one or more delay circuits 414 shown in FIG. 4C. It should also be understood pulse generation circuit 430 may be implemented using other logically or functionally equivalent circuits. Moreover, the example pulse generation circuits shown in FIGS. 4A-4D are just a few examples of many possible pulse generation circuits that may be used to set the time during which embodiment oscillators are activated. In further alternative embodiments, other pulse generation circuits known in the art may be used.

Figure 5A:
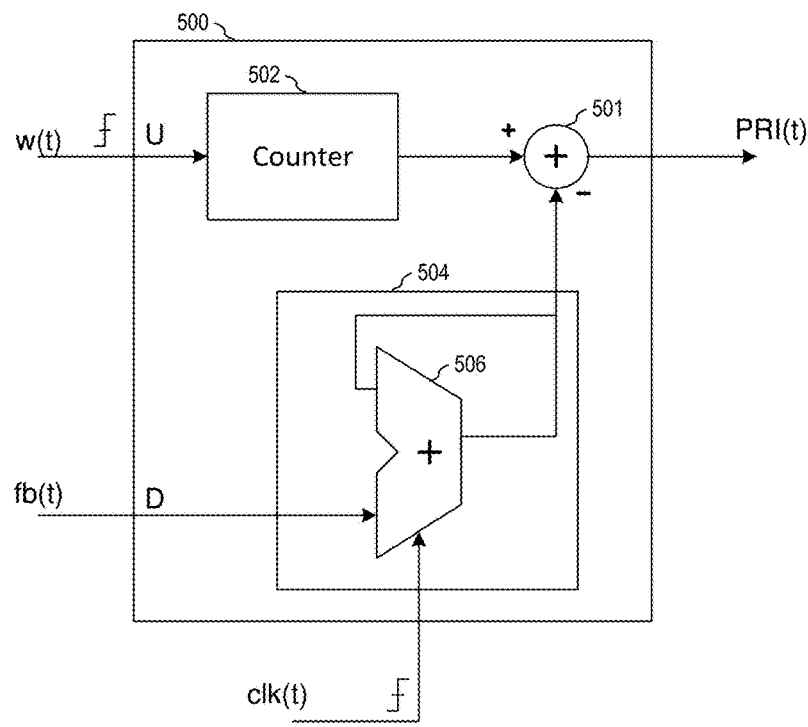
FIG. 5A illustrates a block diagram of an embodiment phase reference integrator.

FIG. 5A illustrates a schematic of an embodiment phase reference integrator 500 that may be used to implement phase reference integrators 106 and 114 shown in FIG. 2A. As shown, phase reference integrator 500 includes counter 502, feedback counter 504 and subtraction circuit 501. Feedback counter 504, which may be implemented using adder 506 with its output coupled to one of its inputs, is configured to be advanced according to the value of fb(t). During operation, counter 502 is advanced at each rising edge of oscillator output signal w(t) to produce a counter output, and feedback counter 504 is advanced by the value of fb(t) at the rising edge of system sampling clock clk(t). Subtraction circuit 501 subtracts the value of feedback counter 504 from the value of counter 502 to produce digital output signal PRI(t). In some embodiments, signal feedback signal fb(t) may be produced by a comparator or other digital circuit coupled to the last phase reference integrator in an a oversampled data converter. In some embodiments, counter 502 and feedback counter 504 may include saturation logic to prevent the counters from saturation. Alternatively, counter 502 and/or counter 504 may be allowed to recycle its value back to zero or some other value when it overflows, such that the difference between counter output values determined by subtraction circuit 501 remains valid. In some embodiments, counter 502 and/or feedback counter 504 may be implemented using a modulo counter.

Figure 5B:
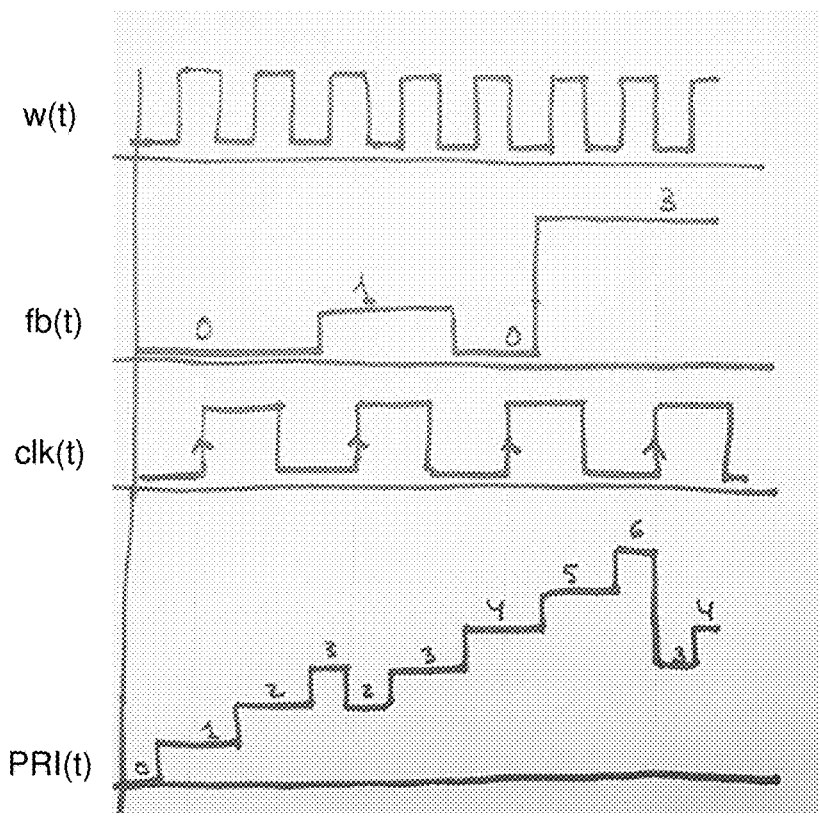
FIG. 5B illustrates a waveform diagram describing the operation of the phase reference integrator shown in FIG. 5A.

FIG. 5B shows a waveform diagram illustrating the operation of embodiment phase reference integrator 500 shown in FIG. 5A. As shown, the value of PRI(t) is incremented at each rising edge of oscillator output signal w(t) and is decremented by the value of fb(t) on each rising edge of system sample clock clk(t). In many embodiments, oscillator output signal w(t) and system sampling clock clk(t) may be asynchronous to each other as shown in FIG. 5B.

In various embodiments, embodiment phase reference integrators generally function as time-to-digital converters. While counter can be used to perform this function as shown in FIG. 5A, other embodiment time-to-digital converter circuits may perform the function of a phase reference integrator without using a counter. For example, time-to-digital converter 550 shown in FIG. 5C includes delay line circuit 552 having an input coupled to oscillator output signal w(t). Delay line circuit 552 has a chain of delay elements 554 connected in series, the inputs and outputs of which are coupled to the data inputs of flip-flops 556. Delay line elements 554 may be implemented, for example, using digital buffer circuits known in the art. During operation, oscillator output signal w(t) propagates through the delay elements 554 of delay line circuit 552, which produces high and low signals at the data inputs D of flip-flops 556. Enable signal Enable(t) clocks flip-flops 556 at the negative edge, and the output of each flop-flop 556 is processed by digital circuit 558, which forms a digital value y[n] based on the states of the outputs of flip-flops 556. In some embodiments, digital circuit 558 is implemented using an encoder followed by a register (not shown), or other digital circuit to map the values of the outputs of flip-flops 556 to a binary value related to period of oscillator output signal w(t).

Figure 5C:
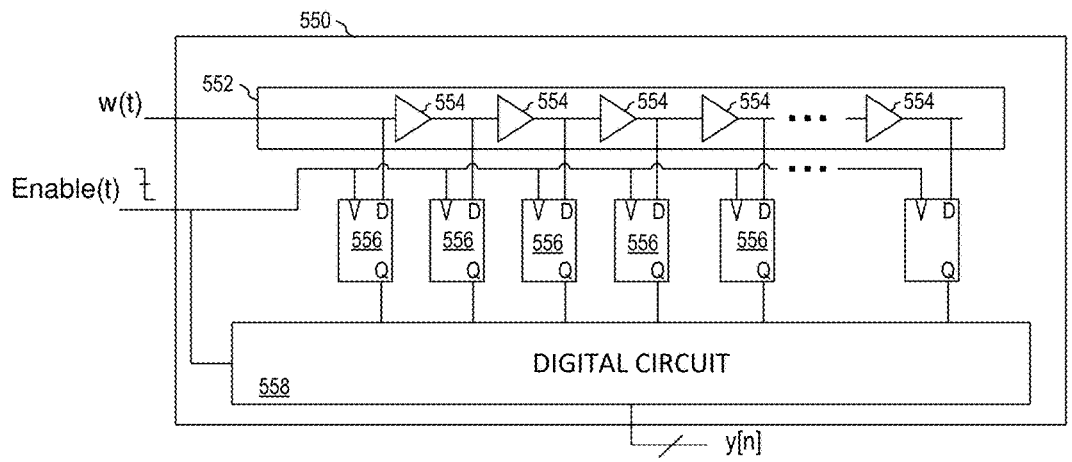
FIG. 5C illustrates an embodiment time-to-digital converter.
Figure 5D:
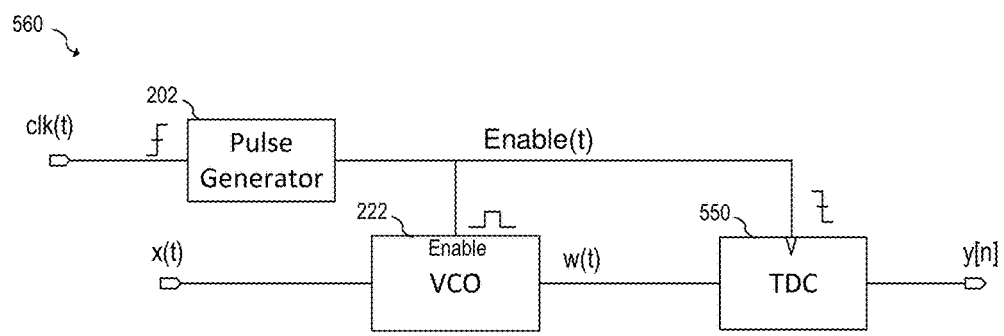
FIG. 5D illustrates a block diagram of a portion of an embodiment first order oscillator-based sigma delta modulator that uses the time-to-digital converter of FIG. 5C.

FIG. 5D illustrates a block diagram of a portion of a first order oscillator-based sigma delta modulator 560 that utilizes time-to-digital converter 550 described above with respect to FIG. 5C. As shown, the clock input of time to digital converter 550, which corresponds to signal Enable(t) shown in FIG. 5C, is coupled to the output of pulse generator 202 that produces a pulse on the rising edge of system sampling clock clk(t). Enable(t) is also coupled to the enable input of VCO 222 that is configured to activate the VCO 222 during a portion of the clock period as described above with respect to FIG. 2B.

It should be understood that phase reference integrator 500 shown in FIG. 5A and time-to-digital converter 550 shown in FIG. 5C are just two examples of many possible circuits that could be used to implement embodiment oscillator-based converters. In alternative embodiments other circuits could be used such as those described in FIGS. 4a, 6, and 7c of U.S. Pat. No. 9,106,211 entitled "System and Method for an Oversampled Data Converter" issued on Aug. 11, 2015 and incorporated herein by reference in its entirety.

Figure 6A:
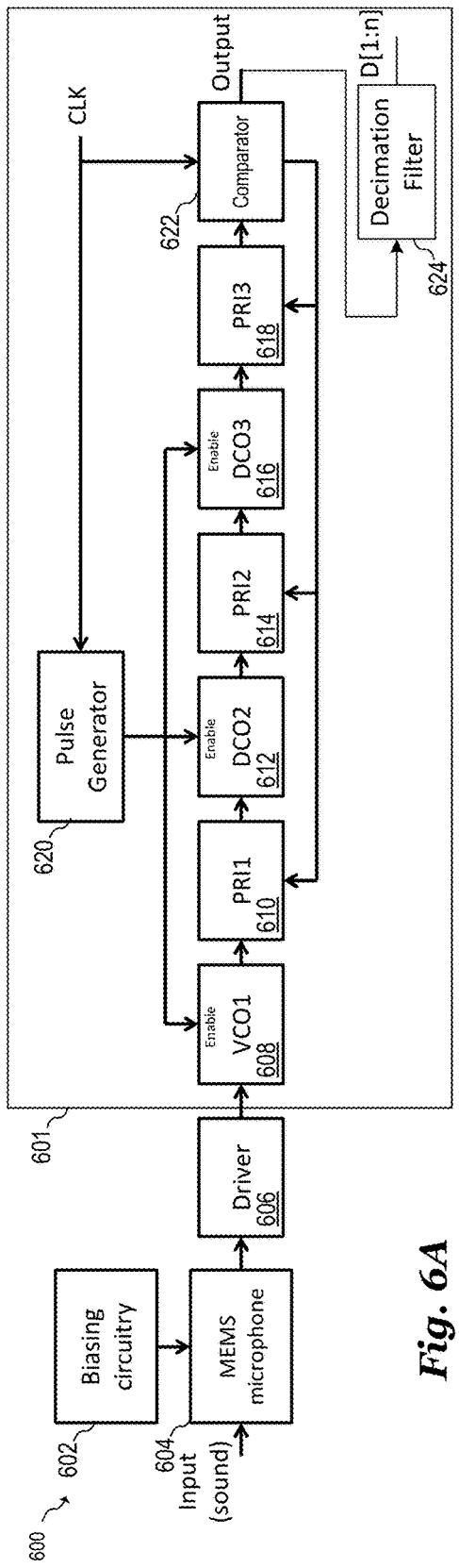
FIG. 6A illustrates and embodiment microphone system.
Figure 6B:
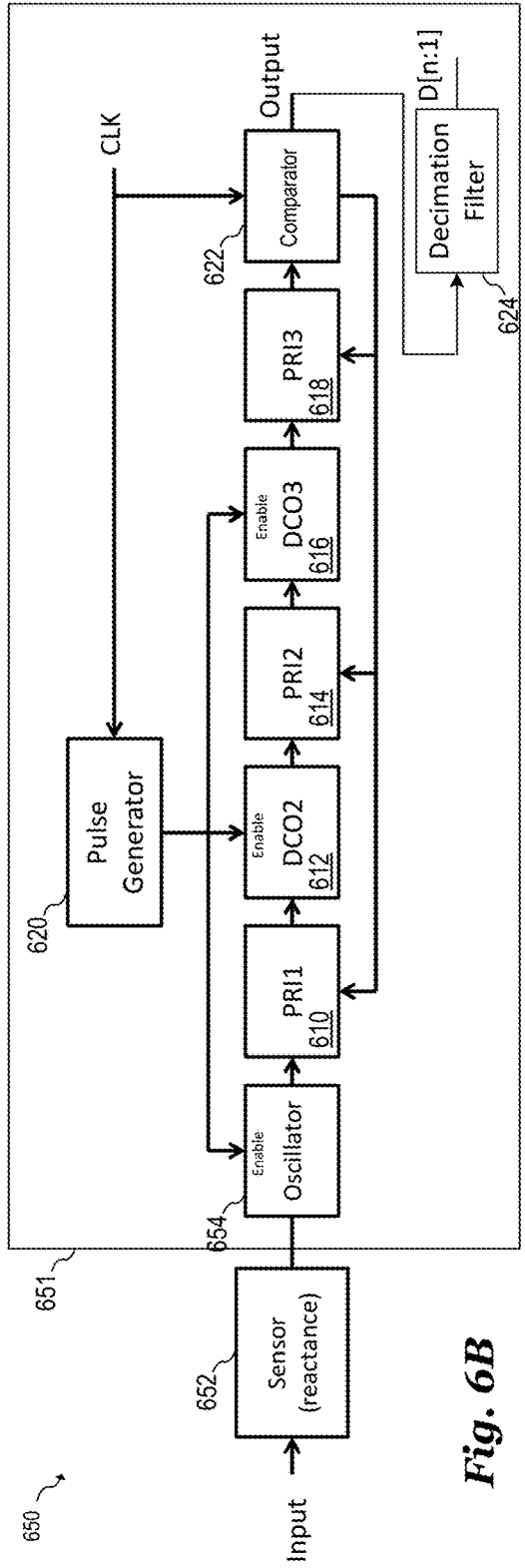
FIG. 6B illustrates an embodiment sensor system.

FIGS. 6A and 6B illustrate two sensor systems according to embodiments of the present invention. FIG. 6A illustrates a digital microphone system 600 that includes MEMS microphone, biasing circuitry 602, driver 606 and embodiment oversampled data converter 601. In an embodiment, MEMS microphone 604 is interfaced to oversampled data converter 601 via driver 606 and is biased via biasing circuitry 602 using driver and MEMS biasing circuitry known in the art. Oversampled data converter 601 includes an oscillator-based third-order sigma-delta modulator having a first stage integrator including VCO 608 and phase reference integrator 610; a second stage integrator including DCO 612 and phase reference integrator 614; and a third stage integrator including DCO 616 and phase reference integrator 618. Oscillators 608, 612 and 616 are enabled and disabled via pulse generator 620 as described above with respect to FIGS. 2A-2C, 3A-F, 4A-4D. Digital circuitry 622 compares the output of phase reference integrator 618 to a threshold and produces a bitstream output and a feedback signal. This feedback signal is used to determine whether counters within phase reference integrators 610, 614 and 618 are incremented or decremented. Decimation filter 624 produces a multi-bit output D[1:n] using decimation circuits and methods known in the art.

In some embodiments, biasing circuitry 602, driver 606 and oversampled data converter 601 are integrated together on a single semiconductor substrate, such as a silicon substrate, to form a monolithic integrated circuit and MEMS microphone 604 is integrated on a separate semiconductor substrate. Alternatively, MEMS microphone 604, biasing circuitry 602, driver 606 and oversampled data converter 601 are integrated together on a single semiconductor substrate. Alternatively, digital microphone system 600 may be partitioned differently over two or more integrated circuits.

FIG. 6B illustrates a sensor system 650 that includes sensor 652 and third-order oversampled data converter 651. Oversampled data converter 651 is similar to oversampled data converter 601 shown in FIG. 6A, with the exception that oscillator 654 of the first integrator interfaces directly with sensor 652. In some embodiments, sensor 652 is used as a reactive element of oscillator 654. For example, if sensor 652 is implemented using a MEMS sensor, the output capacitance may be used as a timing element for oscillator 654. Thus, as the capacitance of MEMS 652 changes, the frequency of oscillation changes. Sensor 652 may be integrated on a same semiconductor substrate as oversampled data converter 651, or may be implemented separate from oversampled data converter 651.

It should be appreciated that the architecture of oversampled data converters 601 and 651 are just two of many examples of embodiment oversampled data converters. In alternative embodiments, the modulator may have a different structure than what is shown in FIGS. 6A and 6B and/or may have a different modulator order and may have greater or fewer than three oscillator-based integrators. In some embodiments, oscillator-based integrators may be combined with non-oscillator-based integrators. Moreover, in some embodiments, only a subset of integrators of an oversampled data converter may utilize embodiment oscillators that may be enabled and disabled. For example, in one embodiment, earlier stages of the modulator may utilize embodiment oscillators, while later stages, where noise is attenuated by the gain of the earlier stages, may utilize noisier stages. The implementation of embodiment modulators may also incorporate architectural details described in U.S. Pat. No. 9,106,211.

The logical functions of the circuits and system disclosed herein may be implemented using custom digital logic, standard cell digital logic, and/or may be implemented in software running on a processor, microcontroller or digital signal processor. Such processors may include, for example, a processor core, memory coupled to the processor core and one or more input/output ports. Alternatively, other circuits and systems known in the art may be used to implement these functions. Embodiment logic circuits may also be implemented using logical equivalents. In some embodiments, active high logic described herein may be implemented using active low logic, circuits that are disclosed as being clocked on a rising edge may be clocked on a falling edge, and counters and circuit configured to be incremented may be decremented and vice-versa. Embodiment circuits may be implemented on a semiconductor substrate, such as a silicon substrate or other substrate type known in the art, using various process technologies such as CMOS, fine geometry CMOS, or other process technologies.

Figure 7:
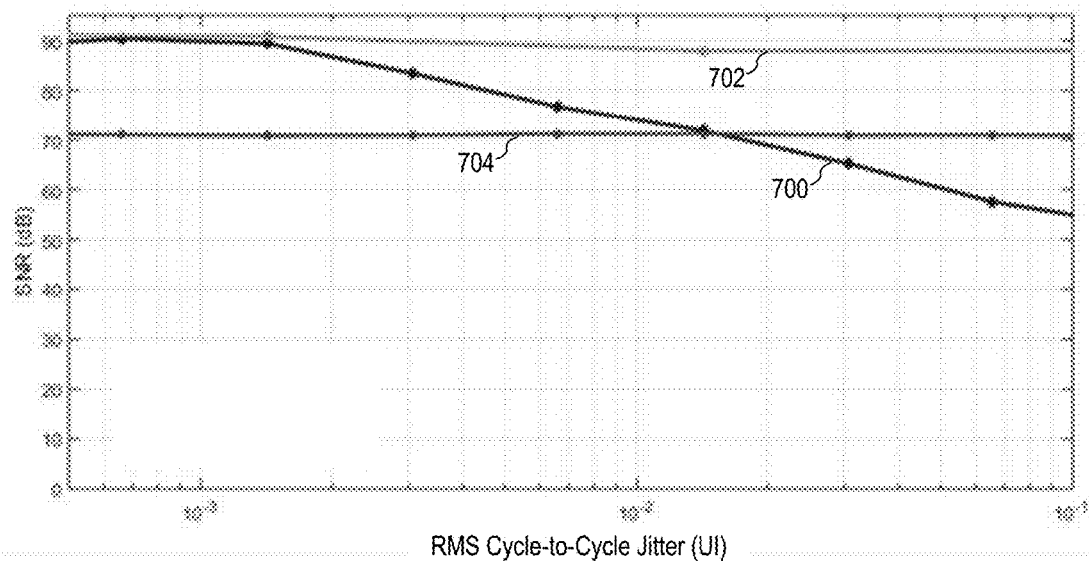
FIG. 7 illustrates a plot of SNR with respect to jitter for various example oversampled data converters.

FIG. 7 illustrates a plot of simulated SNR in dB with respect to cycle to cycle RIMS in unit intervals (UI) for three second-order oversampled modulator systems. Curve 700 represents the SNR of second order oversampled data converter 100 illustrated in FIG. 1A. As shown, the SNR of second order oversampled data converter 100 ranges from about 90 dB for less than $10^{-3}$ RMS UI of jitter to about 55 dB for $10^{-3}$ RMS UI of jitter. Curve 702 represents the SNR of the embodiment second order oversampled data converter 200 illustrated in FIG. 2A in which pulse generator 202 is modeled as producing an ideal constant pulse width. As shown, the SNR of the embodiment second order oversampled data converter 200 is relatively insensitive to clock jitter and maintains an SNR of at least 88 dB in the presence of up to $10^{-3}$ RMS UI of jitter on the system sampling clock. Curve 704 represents the SNR of the embodiment second order oversampled data converter 200 illustrated in FIG. 2A in which pulse generator 202 is modeled as producing a variation of pulse width consistent with a physical circuit. The modeled jitter produced by pulse generator 202 is modeled using a device level circuit simulation of the pulse generator 202 using 130 nm CMOS device models.

As shown, the SNR of the embodiment second order oversampled data converter 200 maintains an approximately constant SNR of at least 70 dB in the presence of up to $10^{-1}$ RMS UI of jitter on the system sampling clock. In this example, the noise of the oversampled converter is dominated by the jitter produced by pulse generator 202. Thus, in the specific example of FIG. 7, the embodiment second order modulator of FIG. 2A outperforms second order modulator shown in FIG. 1A for system sampling clocks having RMS sampling jitter greater than about $1.3 \times 10^{-1}$ RMS UI of jitter. It should be appreciated that the comparative SNR performance illustrated by FIG. 7 is just one specific comparative example. Other embodiment modulator systems may have different SNR performance based on the specific details of the particular system including its modulator architecture, circuit design, device technology, and environmental conditions.

In some embodiments, embodiment second order modulator 200 shown in FIG. 2A may be further configured to have the feature of selectively enabling and disabling embodiment oscillators 204 and 212. Thus, in situations and environments where the provided system sampling clock has a low amount of jitter, the oscillators 204 and 212 shown in the second order modulator 200 could remain enabled during the entire period of system sampling clock clk. In addition, in some embodiments, oscillators 204 and 212 may be configured to have a lower frequency of operation in this mode in order to maintain a loop gain consistent with the mode in which oscillators 204 and 212 are enabled and disabled. In situations and environments where the provided system sampling clock has a high amount of jitter, oscillators 204 and 212 may be enabled and disabled according to the embodiments described above.

Figure 8:
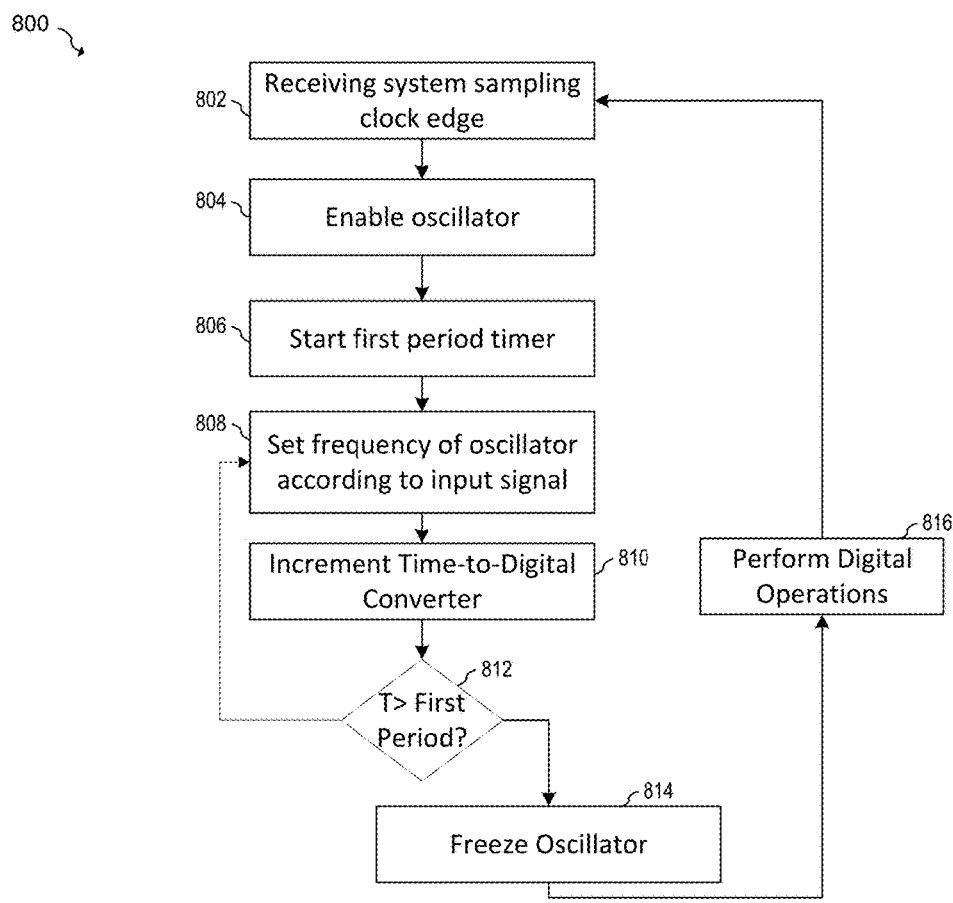
FIG. 8 illustrates a flowchart of an embodiment method.

FIG. 8 illustrates a flowchart 800 of an embodiment method that may be applied to all of the disclosed embodiments. Once a system sampling clock is received in step 802, an oscillator is enabled in step 804, a first period timer is started in step 806, and the frequency of the oscillator is set according to an input signal in step 808. Steps 802, 804, 806 and 808 or a subset of these steps may occur sequentially or simultaneously. In some embodiments, the oscillator may be a first stage oscillator, such as oscillators 204, 508 and 554 shown in FIGS. 2A, 5A and 5B, respectively. The oscillator may also be a later stage oscillator such as oscillator 212 shown in FIG. 2A, oscillators 612 and 616 shown in FIG. 6A or oscillators 654, 612 and 616 shown in FIG. 6B. The first period timer may be implemented using embodiment pulse generators disclosed herein.

In step 810, a value of a time-to-digital converter, such as an embodiment phase reference integrator described herein, is incremented each time an oscillation cycle is produced by the oscillator. In some alternative embodiments, the value of the time-to-digital converter may be decremented instead of incremented. In step 812 a determination is made whether or not a first period of time has expired. If the first period of time has not expired, then steps 808, 810 and 812 are repeated and oscillations continue to be incremented via the time-to-digital converter. If the first period of time has expired, then the oscillator is frozen in step 814 until the next system sampling clock edge is received in step 802. In embodiments that implement higher order modulators using multiple oscillators, all oscillators or a subset of the oscillators may be frozen in step 814. Alternatively, the oscillator may be disabled by significantly reducing the frequency of oscillation such that the phase of the oscillator advances at a slow rate compared to its nominal operating frequency. In step 816, various digital operations may be performed including, for example, determining whether or not the output of the last phase reference integrator is above or below a threshold and/or updating the value of the feedback that determines the degree to which the phase reference integrator feedback counters are incremented (or decremented depending on the particular implementation). Once the next system sampling clock edge has been received, steps 804, 806, 808, 810, 812 and 814 are repeated.

Example embodiments of the present invention are summarized here. Other embodiments can also be understood from the entirety of the specification and the claims filed herein.

Example 1

A circuit including: a first oscillator having an oscillation frequency dependent on an input signal at a first input, where the first oscillator is configured to oscillate when an enable input is in a first state and freeze its phase when the enable input is in a second state; a first time-to-digital converter having an input coupled to an output of the first oscillator; and a pulse generator having an input coupled to a first clock input of the circuit and an output coupled to the enable input of the first oscillator, where the pulse generator is configured to produce a pulse having pulse width less than a period of a clock signal at the first clock input.

Example 2

The circuit as in example 1, where the first time-to-digital converter includes a counter having a clock input coupled to the output of the first oscillator.

Example 3

The circuit as in one of examples 1 or 2, further including an oscillator-based integrator stage, where the oscillator-based integrator stage includes: a digitally controlled oscillator (DCO) having a frequency control input coupled to the output of the first time-to-digital converter; and a second time-to-digital converter having an input coupled to an output of the DCO.

Example 4

The circuit as in one of examples 1-3, where the DCO further includes an enable input coupled to the output of the pulse generator, and the DCO is configured to oscillate when the enable input is in a first state and freeze its phase when the enable input is in the second state.

Example 5

The circuit as in one of examples 1-4, further including: a feedback counter; a subtraction circuit having a first input coupled to an output of the first time-to-digital converter, and a second input coupled to an output of the feedback counter; and a comparator having an input coupled to an output of the feedback counter and an output coupled to an up/down selection input of the feedback counter.

Example 6

The circuit as in one of examples 1-5 where the pulse generator includes a second oscillator; a counter having an input coupled to an output of the second oscillator and a reset input coupled to the first clock input of the circuit; and a comparator coupled to an output of the counter.

Example 7

The circuit as in one of examples 1-5, where the pulse generator includes a flip-flop having a set input coupled to the first clock input of the circuit; and a delay circuit coupled between an output of the flip-flop and a reset input of the flip-flop.

Example 8

The circuit as in one of examples 1-7, where the first oscillator includes a ring oscillator, and the ring oscillator includes a plurality of stages, where each stage of the plurality of stages includes an inverter and a switch coupled between a supply terminal of the inverter and a power supply node, and the switch includes an control node coupled to the enable input of the first oscillator.

Example 9

The circuit as in one of examples 1-7, where the first oscillator includes a relaxation oscillator.

Example 10

A method of operating a circuit, the method including: receiving an input signal; enabling a first oscillator for a first period of time upon receiving an edge transition of a clock signal, where the first period of time is less than a period of the clock signal, and the first oscillator produces an oscillation signal having a frequency based on the input signal; counting a number of oscillations of the oscillation signal after receiving the edge transition of the clock signal; and freezing the first oscillator at an end of the first period of time.

Example 11

The method as in example 10, where receiving the input signal includes receiving the input signal from a microphone.

Example 12

The method as in one of examples 10 or 11, where enabling the first oscillator for the first period of time further includes producing a pulse having a pulse width of the first period of time upon receiving the edge transition of the clock signal, and applying the pulse to an enable input of the first oscillator.

Example 13

The method as in one of examples 10-12, further including applying the counted number of oscillations to n−1 oscillator-based integrator-based stages coupled in series with the first oscillator, where each oscillator-based integrator-based stage includes a digital input port, a digital output port, a frequency controllable oscillator configured to have a frequency proportional to value of the digital input port, and a time-to-digital converter having a clock input coupled to an output of the frequency controllable oscillator and an output coupled to the digital output port, where n is an integer greater than or equal to two.

Example 14

The method as in one of examples 10-13, further including: comparing the counted number of oscillations with a first threshold; incrementing a feedback counter based on the comparing; and subtracting a value of the feedback counter from the counted number of oscillations.

Example 15

The method as in one of examples 10-13, further including producing a bitstream based on the comparing, where the bitstream includes an oversampled digital representation of the received input signal.

Example 16

A circuit including: a pulse generator having an input coupled to a clock input of the circuit, where the pulse generator is configured to produce a pulse having a pulse width less than a period of a clock signal at the clock input; and a plurality of oscillator-based integrator stages coupled in series, where each oscillator-based integrator-based stage includes an oscillator and a phase reference integrator coupled to an output of the oscillator, and the oscillator of at least one of the plurality of oscillator-based integrator stages is configured to freeze its phase according to the pulse produced by the pulse generator.

Example 17

The circuit as in example 16, further including a comparison circuit having an input coupled to a last stage of the plurality of oscillator-based integrator stages and an output coupled to the phase reference integrator of each of the plurality of oscillator-based integrator stages.

Example 18

The circuit as in one of example 16 or 17, further including a decimation filter coupled to the output of the comparison circuit.

Example 19

The circuit as in one of examples 16-18, further including a MEMS sensor having an output coupled to an input of a first stage of the plurality of oscillator-based integrator stages.

Example 20

The circuit of example 19, where the MEMS sensor is a MEMS microphone.

Example 21

The circuit of as in one of examples 16-20, where the pulse generator and the plurality of oscillator-based integrator stages are disposed on a semiconductor substrate.

Example 22

A circuit including: a first oscillator having an oscillation frequency dependent on an input signal at a first input, where the first oscillator is configured to oscillate when an enable input is in a first state and to oscillate at a reduced frequency when the enable input is in a second state; a first time-to-digital converter having an input coupled to an output of the first oscillator; and a pulse generator having an input coupled to a first clock input of the circuit and an output coupled to the enable input of the first oscillator, where the pulse generator is configured to produce a pulse having pulse width less than a period of a clock signal at the first clock input.

Example 23

The circuit of example 22, where the reduced frequency is at least ten times lower than the oscillation frequency when the enable input is in a first state.

Advantages of embodiments include the ability to achieve a higher SNR in an oversampled data converter having oscillator-based integrators in the presence of a jittered system clock. A further advantage includes a reduced risk of metastability in an oscillator-based oversampled converter in which the oscillator-based integrators and the system clock operate asynchronously to each other.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The research leading to this invention has received funding from the People Programme (Marie Curie Actions) of the European Union's Seventh Framework Programme (FP7/2007-2013) under REA grant agreement n° [xxxxxx].11.

What is claimed is:

1. A circuit comprising:
    a first oscillator having an oscillation frequency dependent on an input signal at a first input, wherein the first oscillator is configured to oscillate when an enable input is in a first state and freeze its phase when the enable input is in a second state, a present phase of the first oscillator is configured to be stored when the first oscillator freezes its phase, and the first oscillator is configured to resume operation at substantially its previously stored phase;
    a first time-to-digital converter having an input coupled to an output of the first oscillator; and
    a pulse generator having an input coupled to a first clock input of the circuit and an output coupled to the enable input of the first oscillator, wherein the pulse generator is configured to produce a pulse having pulse width less than a period of a clock signal at the first clock input.

2. The circuit of claim 1, wherein the first time-to-digital converter comprises a counter having a clock input coupled to the output of the first oscillator.

3. The circuit of claim 1, further comprising an oscillator-based integrator stage, the oscillator-based integrator stage comprising:
    a digitally controlled oscillator (DCO) having a frequency control input coupled to the output of the first time-to-digital converter; and
    a second time-to-digital converter having an input coupled to an output of the DCO.

4. The circuit of claim 3, wherein the DCO further comprises an enable input coupled to the output of the pulse generator, and the DCO is configured to oscillate when the enable input is in the first state and freeze its phase when the enable input is in the second state.

5. The circuit of claim 1, further comprising:
a feedback counter;
a subtraction circuit having a first input coupled to an output of the first time-to-digital converter, and a second input coupled to an output of the feedback counter; and
a comparator having an input coupled to the output of the feedback counter and an output coupled to an up/down selection input of the feedback counter.

6. The circuit of claim 1, wherein the pulse generator comprises:
a second oscillator;
a counter having an input coupled to an output of the second oscillator and a reset input coupled to the first clock input of the circuit; and
a comparator coupled to an output of the counter.

7. The circuit of claim 1, wherein the pulse generator comprises:
a flip-flop having a set input coupled to the first clock input of the circuit; and
a delay circuit coupled between an output of the flip-flop and a reset input of the flip-flop.

8. The circuit of claim 1, wherein the first oscillator comprises a ring oscillator, the ring oscillator comprising a plurality of stages, wherein each stage of the plurality of stages comprises an inverter and a switch coupled between a supply terminal of the inverter and a power supply node, and the switch comprises an control node coupled to the enable input of the first oscillator.

9. The circuit of claim 1, wherein the first oscillator comprises a relaxation oscillator.

10. A method of operating a circuit, the method comprising:
receiving an input signal;
enabling a first oscillator for a first period of time upon receiving an edge transition of a clock signal, wherein the first period of time is less than a period of the clock signal, and the first oscillator produces an oscillation signal having a frequency based on the input signal;
counting a number of oscillations of the oscillation signal after receiving the edge transition of the clock signal; and
freezing the first oscillator at an end of the first period of time, wherein freezing the first oscillator comprises storing a present phase of the first oscillator when the first oscillator freezes its phase, and the first oscillator is configured to resume operation at substantially its previously stored phase when the first oscillator is enabled.

11. The method of claim 10, wherein receiving the input signal comprises receiving the input signal from a microphone.

12. The method of claim 10, wherein enabling the first oscillator for the first period of time further comprises producing a pulse having a pulse width of the first period of time upon receiving the edge transition of the clock signal, and applying the pulse to an enable input of the first oscillator.

13. The method of claim 10, further comprising applying the counted number of oscillations to n−1 oscillator-based integrator-based stages coupled in series with the first oscillator, wherein each oscillator-based integrator-based stage comprises a digital input port, a digital output port, a frequency controllable oscillator configured to have a frequency proportional to value of the digital input port, and a time-to-digital converter having a clock input coupled to an output of the frequency controllable oscillator and an output coupled to the digital output port, wherein n is an integer greater than or equal to two.

14. The method of claim 13, further comprising:
comparing the counted number of oscillations with a first threshold;
incrementing a feedback counter based on the comparing; and
subtracting a value of the feedback counter from the counted number of oscillations.

15. The method of claim 14, further comprising producing a bitstream based on the comparing, wherein the bitstream comprises an oversampled digital representation of the received input signal.

16. A circuit comprising:
a pulse generator having an input coupled to a clock input of the circuit, wherein the pulse generator is configured to produce a pulse having a pulse width less than a period of a clock signal at the clock input; and
a plurality of oscillator-based integrator stages coupled in series, wherein each oscillator-based integrator-based stage comprises an oscillator and a phase reference integrator coupled to an output of the oscillator, and the oscillator of at least one of the plurality of oscillator-based integrator stages is configured to freeze its phase according to the pulse produced by the pulse generator, a present phase of the oscillator is configured to be stored when the oscillator freezes its phase, and the oscillator is configured to resume operation at substantially its previously stored phase.

17. The circuit of claim 16, further comprising a comparison circuit having an input coupled to a last stage of the plurality of oscillator-based integrator stages and an output coupled to the phase reference integrator of each of the plurality of oscillator-based integrator stages.

18. The circuit of claim 17, further comprising a decimation filter coupled to the output of the comparison circuit.

19. The circuit of claim 17, further comprising a MEMS sensor having an output coupled to an input of a first stage of the plurality of oscillator-based integrator stages.

20. The circuit of claim 19, wherein the MEMS sensor is a MEMS microphone.

21. The circuit of claim 16, wherein the pulse generator and the plurality of oscillator-based integrator stages are disposed on a semiconductor substrate.

22. A circuit comprising:
a first oscillator having an oscillation frequency dependent on an input signal at a first input, wherein the first oscillator is configured to oscillate when an enable input is in a first state and to oscillate at a reduced frequency when the enable input is in a second state, wherein the reduced frequency is greater than zero;
a first time-to-digital converter having an input coupled to an output of the first oscillator; and
a pulse generator having an input coupled to a first clock input of the circuit and an output coupled to the enable input of the first oscillator, wherein the pulse generator is configured to produce a pulse having pulse width less than a period of a clock signal at the first clock input.

23. The circuit of claim 22, wherein the reduced frequency is at least ten times lower than the oscillation frequency when the enable input is in the first state.

* * * * *